United States Patent
Kuo et al.

(10) Patent No.: US 8,436,686 B2
(45) Date of Patent: May 7, 2013

(54) METHOD AND APPARATUS FOR EFFICIENT TIME SLICING

(75) Inventors: Feng Wei Kuo, Zhudong Township (TW); Ying-Ta Lu, Fanlu Township (TW); Chewn-Pu Jou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 106 days.

(21) Appl. No.: 12/885,974

(22) Filed: Sep. 20, 2010

(65) Prior Publication Data

US 2012/0068742 A1    Mar. 22, 2012

(51) Int. Cl.
*H03L 7/00* (2006.01)
(52) U.S. Cl.
USPC ............. 331/16; 331/1 R; 331/10; 331/34; 331/177 R; 331/179; 375/376
(58) Field of Classification Search ............ 331/1 R, 331/10, 16, 34, 177 R, 179; 375/376
See application file for complete search history.

(56) References Cited

U.S. PATENT DOCUMENTS

| | | | |
|---|---|---|---|
| 6,597,249 B2* | 7/2003 | Chien et al. | 331/177 R |
| 7,023,284 B2* | 4/2006 | Sogawa et al. | 331/10 |
| 8,008,956 B1* | 8/2011 | Shin et al. | 327/157 |
| 2009/0091396 A1* | 4/2009 | Jian et al. | 331/16 |
| 2009/0115537 A1* | 5/2009 | Ramaswamy et al. | 331/44 |
| 2010/0007425 A1* | 1/2010 | Kondou et al. | 331/34 |
| 2010/0127739 A1* | 5/2010 | Ebuchi et al. | 327/148 |
| 2010/0213984 A1* | 8/2010 | Shin et al. | 327/105 |
| 2010/0237951 A1* | 9/2010 | Kwok | 331/10 |

* cited by examiner

*Primary Examiner* — Arnold Kinkead
*Assistant Examiner* — Richard Tan
(74) *Attorney, Agent, or Firm* — Lowe Hauptman Ham & Berner, LLP (57) ABSTRACT

Apparatus for efficient time slicing including a phase lock loop circuit having a voltage controlled oscillator, an auto-frequency calibration circuit coupled with the phase lock loop circuit configured to output a value to select a range of the voltage controlled oscillator, and a burst mode detector connected with the auto-frequency calibration circuit. The burst mode detector having a register adapted to store the output of the auto-frequency calibration circuit.

20 Claims, 8 Drawing Sheets

METHOD AND APPARATUS FOR EFFICIENT TIME SLICING

BACKGROUND

Mobile devices such as cell phones require a significant source of power for computation, displays and communication with cell phone towers and other radio networks. Mobile devices with long battery lives are desired by users in order to use the mobile device for long periods of time without recharging the battery. Moreover, the amount of complex processing required by mobile devices is increasing as functionality increases. One approach to increased power consumption requirements is to increase the size of batteries used in mobile devices.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

This application is directed to reducing the power consumption of a radio receiver or transmitter operating in an intermittent mode. The power is reduced by reducing the time required to synchronize components of the receiver or transmitter before the transmission or reception of signals.

Figure 1:
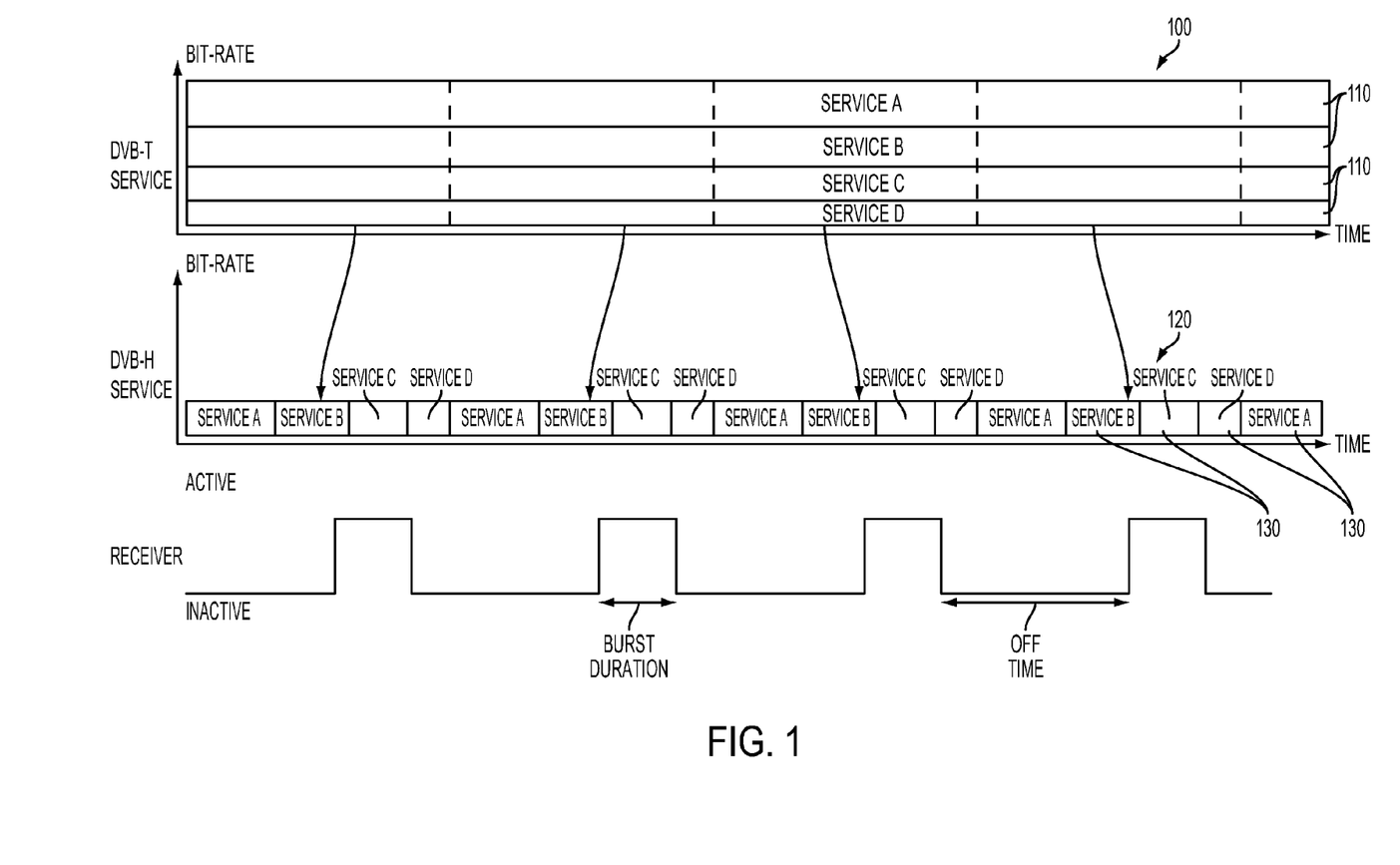
FIG. 1 is a schematic diagram of methods of transmitting data.

Technologies deployed to save power for mobile devices include the Digital Video Broadcasting-Handheld (DVB-H) standard. This technology is a superset of the Digital Video Broadcasting-Terrestrial (DVB-T) standard for digital terrestrial television, with additional features to meet the specific requirements of handheld, battery-powered receivers. FIG. 1 includes graphs 100 and 120 of the bit rates of various channels 110 and 130 over time. A key difference between the DVB-T and DVB-H standards is that the channels in the DVB-H standard are time sliced. Services A, B, C and D in FIG. 1 are, for example, different TV programs. When transmitted using the DVB-T standard, the bit rate for each channel is constant over time. Therefore, a receiver must be powered up constantly to receive, for example, service A on one of the channels 110. When transmitted using the DVB-H standard, the bit rate for each channel is not constant with time. Bursts for each channel are transmitted sequentially. Thus, the channels 130 are time sliced. Therefore, a receiver must be powered up only when the channel that the receiver is requested to receive is being transmitted, for example, service A on one of the channels 130. Thus, the receiver in the DVB-H standard only needs to be switched on a fraction of the time, thereby saving power when the receiver is switched off. The DVB-H standard is only an example of a time sliced system and this application is applicable to any transmission system that uses time slicing for transmitting or receiving signals.

Figure 2:
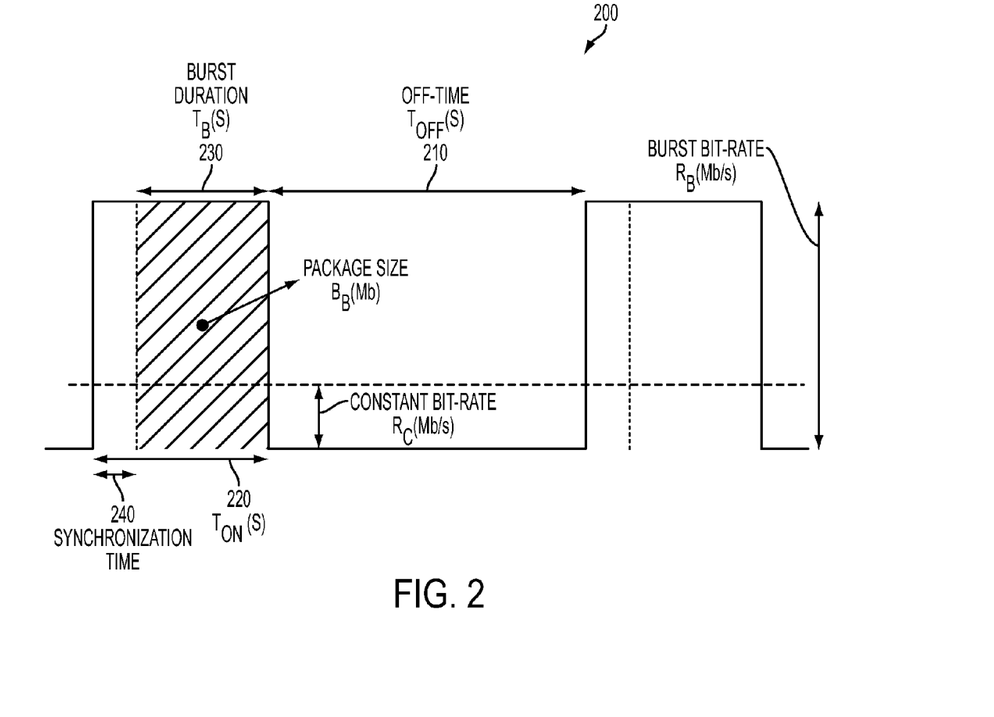
FIG. 2 is a timing diagram of a burst mode method of transmitting and receiving data.

FIG. 2 is a graph 200 of the receiver on and off time and bit rate for a channel, for example, a channel 130 in FIG. 1. The data is transmitted on the channel for a Burst Duration time period ($T_B$) 230. The receiver is switched on during a synchronization time period 240 before the time period $T_B$ and switched on during $T_B$ to receive the data. The receiver is switched off at other time periods $T_{off}$ 210 between bursts to save power. The receiver cannot be switched on as the burst begins but requires the synchronization time 240, before the burst to synchronize to the transmitted frequency of the transmitter. Therefore, the receiver is switched on for a time period ($T_{ON}$) 220 longer than $T_B$ 230. Methods that reduce the above synchronization time period 240, reduce the power used by the receiver.

Figure 3:
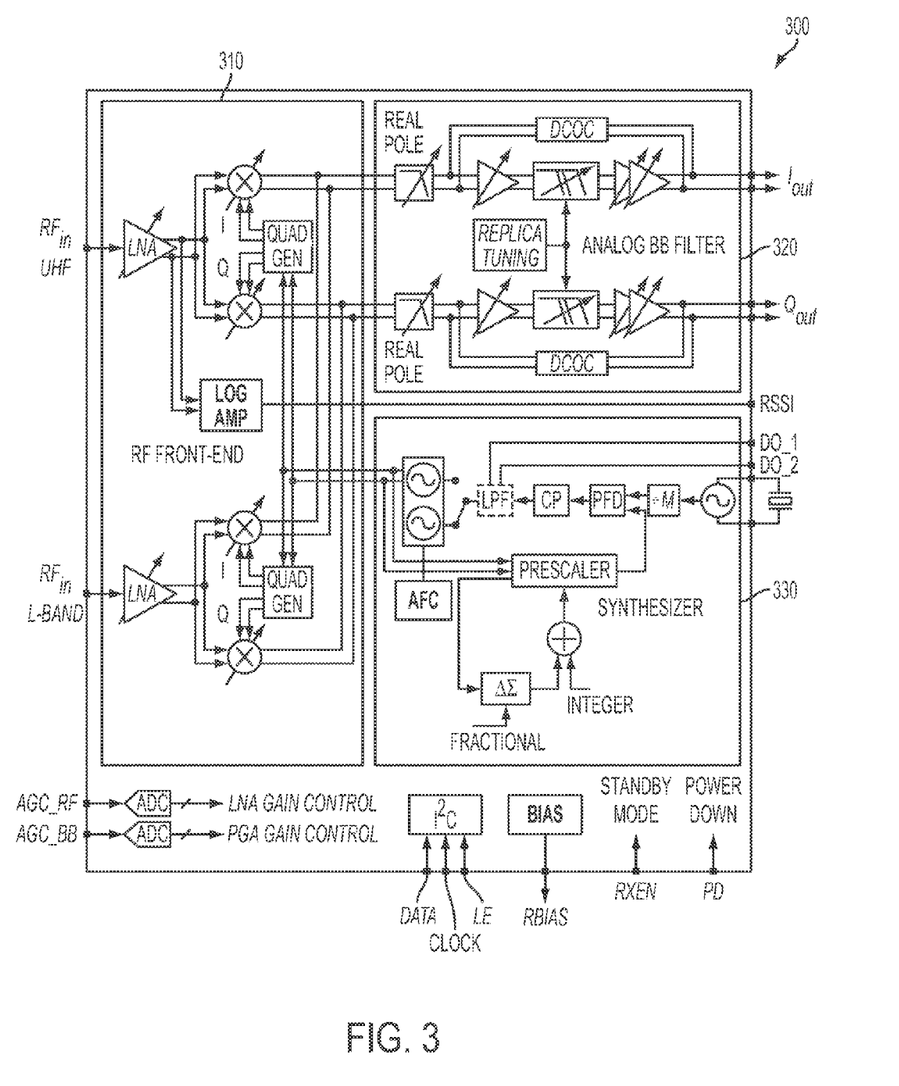
FIG. 3 is a high-level functional schematic diagram of a receiver.

FIG. 3 is a high-level functional schematic diagram of a receiver 300. The receiver comprises a radio frequency (RF) front end 310 that downconverts the received ultrahigh frequency (UHF) and L-Band signals to a baseband signal, by mixing the UHF and L-Band signals with a reference signal produced by a synthesizer 330. The downconverted signals are filtered by a baseband filter 320 to remove unwanted channels that are not within the baseband of the baseband filter 320. The frequency produced by the synthesizer 330 is allowed to differ from a requested frequency by an amount that is small compared with a frequency spacing between channels so that a single channel is selected from the multiple closely spaced channel frequencies. Further, the synthesizer 330 produces frequencies over a wide frequency range, so that a single receiver covers a wide frequency range and, therefore, is capable of being tuned to receive one of a large number of channels.

The synchronization time period 240 discussed above with respect to FIG. 2, is due to the time period taken for the synthesizer 330 to adjust to the correct frequency after a particular frequency is requested. Reducing this adjustment time period lowers the power consumption of the receiver 300.

Figure 4:
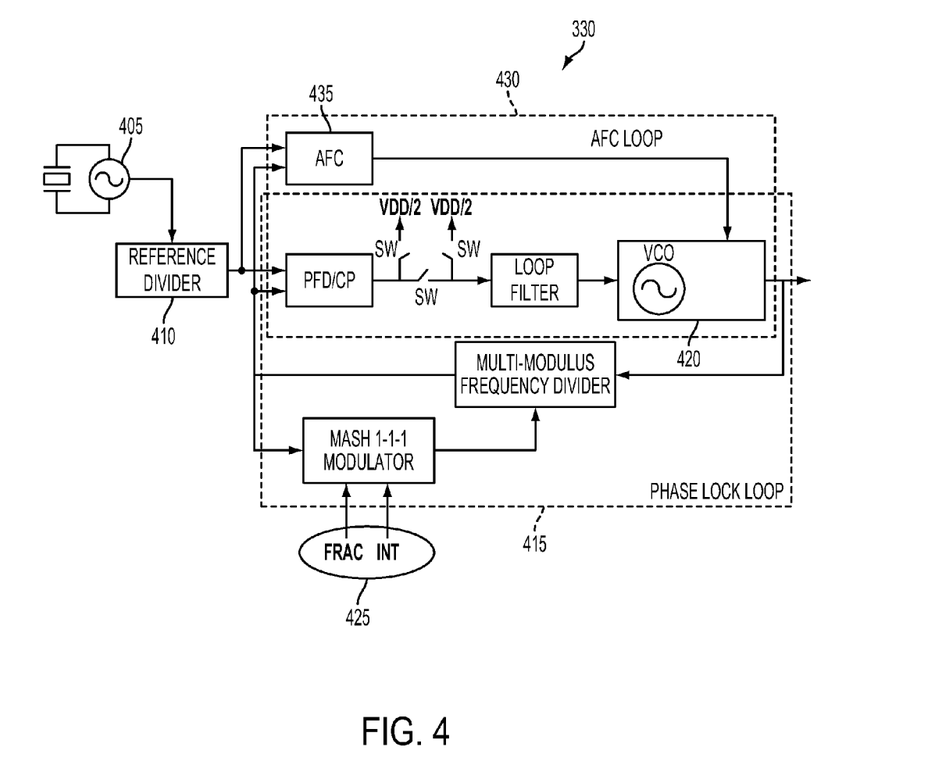
FIG. 4 is a high-level functional schematic diagram of a frequency synthesizer.

FIG. 4 is a high-level functional schematic diagram of the frequency synthesizer 330. The frequency synthesizer 330 comprises a reference frequency generator 405 that generates a reference frequency. The reference frequency is divided by a reference divider 410 to calculate a divided reference frequency. The divided reference frequency is fed into a phase frequency detector (PFD) of a phase lock loop (PLL) 415. The PFD compares the output of a voltage controlled oscillator VCO 420 that has been divided by a multi-modulus frequency divider of the PLL 415 with the divided reference frequency. The PFD outputs an error signal based on the difference in frequency and/or phase between the multi-modulus frequency divider and the divided reference frequency. The error signal output from the PFD is used to correct the frequency of the VCO 420 so that the frequency output by the VCO 420 is the divided reference frequency multiplied by the value by which the multi-modulus frequency divider divides. The value by which the multi-modulus frequency divider divides is determined by the inputs 425 to the PLL 415. The inputs 425 are set according to the channel to be received.

The PLL 425 described above, works if the range of frequencies to be produced by the synthesizer 330 is small. For larger frequency ranges, the PLL 415 cannot be adjusted accurately using the output of the PFD alone because a VCO with a single large frequency range adjusted only by the output of the PFD is inherently inaccurate at producing a specific frequency. Therefore, in addition to the output of the PFD, an automatic frequency calibration loop 430 selects a frequency range of the VCO 420 from among a set of frequency ranges where each of the set of frequency ranges covers a portion of the frequencies to be produced by the synthesizer 330.

The automatic frequency calibration loop 430 comprises an automatic frequency calibrator (AFC) 435 that selects a suitable frequency range for the VCO 420 of the PLL 415. The suitable frequency range is selected from among a set of frequency ranges that cover the range of frequencies the frequency synthesizer is required to produce. If the VCO 420 cannot produce the frequency requested by the input 425 to the PLL 415, the AFC 435 searches for a frequency range of the VCO 420 that allows the VCO 420 to produce the requested frequency. The AFC 435 searches, for example, by using a binary search through the frequency ranges of the VCO 420. Any other known or future developed method for the AFC 435 to search for a suitable range for the VCO 420 is usable in connection with one or more embodiments of the present disclosure.

Figure 5:
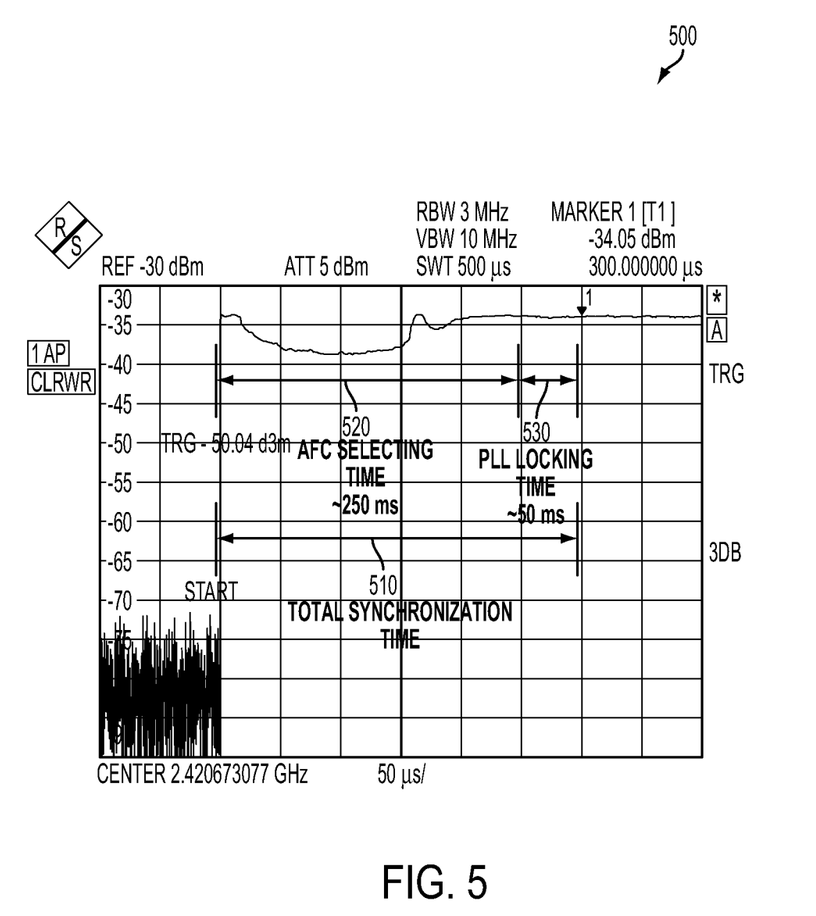
FIG. 5 is a graph of a time slicing timing diagram for the synthesizer in FIG. 4.

FIG. 5 is a graph 500 of a total synchronization time period 510 for the synthesizer of FIG. 4. The total synchronization time period 510 comprises an AFC selecting time period 520 and a PLL 415 locking time period 530 for the synthesizer 330 of FIG. 4. The AFC selecting time period 520 is longer than the PLL time period 530. Therefore, if the AFC selecting time period is removed or reduced, the power consumption of the receiver 300 is reduced because the receiver 300 is not powered for the AFC selecting time period 520.

Figure 6:
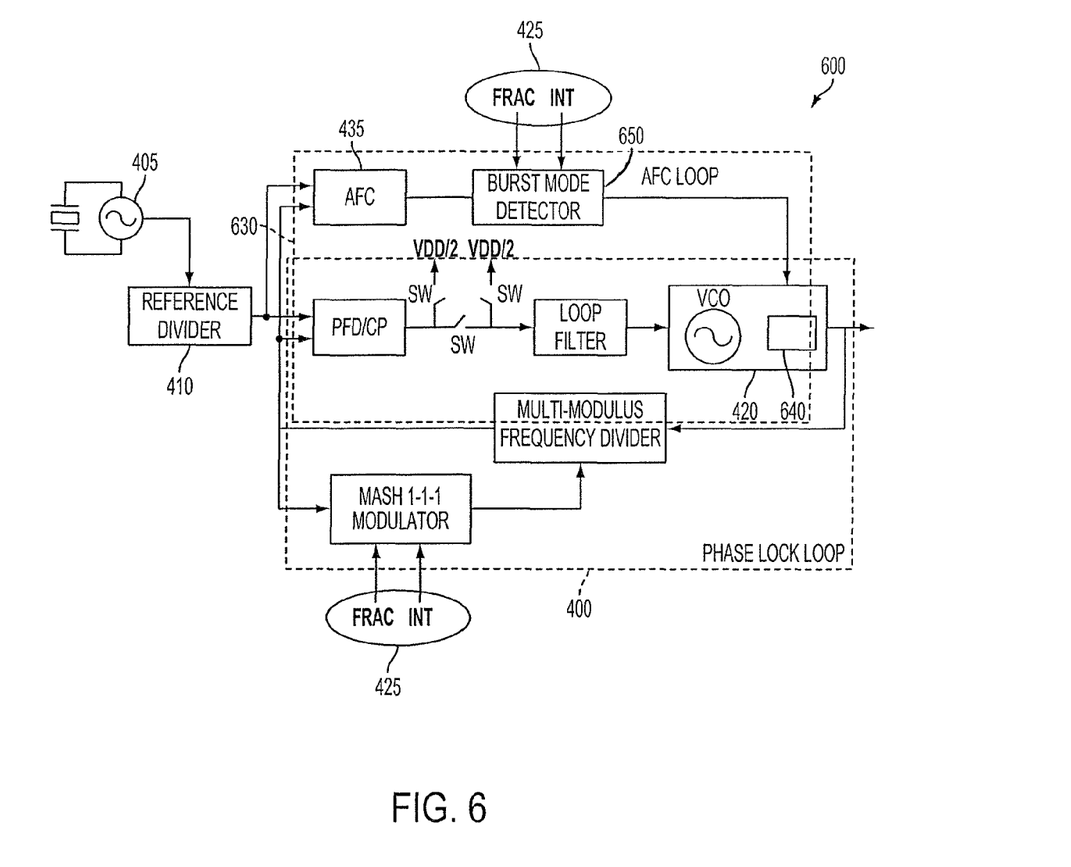
FIG. 6 is a high-level functional schematic diagram of a frequency synthesizer according to an embodiment.

FIG. 6 is a high-level functional schematic diagram of a frequency synthesizer 600 according to an embodiment. The frequency synthesizer 600 is similar to the frequency synthesizer 400 in FIG. 4. In some embodiments, an automatic frequency control loop 630 further comprises a burst mode detector (BMD) 650. The BMD 650 operates during burst mode reception, for example, in the DVB-H standard as discussed above. In burst mode, the frequency of the receiver is not changed between bursts because the same channel and frequency are used. Therefore, in burst mode, the BMD 650 stores the last setting for the VCO 420 determined by the AFC 435. Rather than the AFC searching for a range to set the VCO 420, the BMD 650 sends the stored AFC value to the VCO 420 to select the range of the VCO 420. Thus, the AFC setting time period is removed from the synchronization time period. The power used by an embodiment of a synchronizer that includes a BMD, for example, BMD 650, is lower than a synchronizer that does not include a BMD. The BMD 650 has as inputs, the inputs 425. As discussed above, the inputs 425 are set according to the channel to be received. The BMD 650 determines if the frequency requested in the next burst is the same as the frequency requested for the previous burst using the inputs 425.

In some embodiments, the AFC output selects a range of the VCO 420 by, for example, selecting a capacitor or capacitors of a switch capacitor bank 640 of the VCO 420. Any other known or future developed method for selecting for a suitable frequency range by the VCO 420 is usable in connection with one or more embodiments of the present disclosure.

Figure 7:
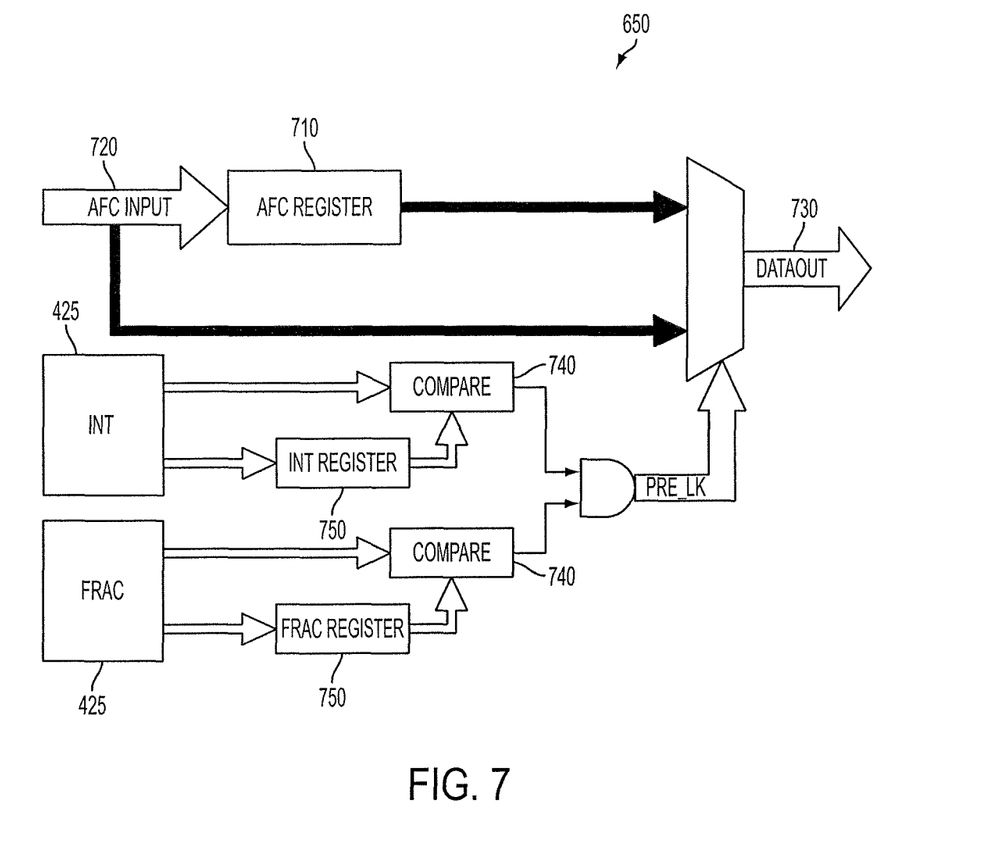
FIG. 7 is a high-level functional schematic diagram of a burst mode detector according to an embodiment.

FIG. 7 is a high level functional schematic diagram of the burst mode detector 650 according to one embodiment. The value selected by the AFC 435 is input at an input 720 of the BMD 650. The AFC register 710 stores the previous value input at the input 720.

The currently requested frequency input 425 is input to a comparator 740. In some embodiments, the currently requested frequency input 425 is divided into more than one input, for example, an integer (INT) part and a fractional part (FRAC) as in FIG. 7. Other embodiments use one input or more than two inputs for the currently requested frequency input 425. These two parts are sent to separate comparators 740. The comparators 740 compare the currently requested frequency input 425 with the previously requested frequency input stored in the registers 750. The results of the comparators 740 are compared and if the comparators 740 determine that the currently requested frequency input 425 matches the previously requested frequency input stored in the registers 750, the value stored in the AFC Register 710 is output on the output 730 of the BMD 650. If the comparators 740 determine that the currently requested frequency input 425 differs from the previously requested frequency input stored in the registers 750, the value input from the AFC on input 720 of the BMD 650 is output on the output 730 of the BMD 650. Further, the AFC on input 720 of the BMD 650 is stored in the AFC register 710. In this manner, the search by the AFC 435 is avoided if the currently requested frequency is not changed between bursts. If the currently requested frequency is changed compared to the previously requested frequency values in the registers 750, the two parts of currently requested frequency input 425 are stored as previously requested frequency values in the registers 750.

In some embodiments, the BMD 650 comprises a plurality of registers 710 to store multiple previous outputs of the AFC 435 circuit and a plurality of corresponding registers 750 to store previously requested frequency values. A plurality of corresponding comparators 740 is used to compare the previously requested frequency values in the corresponding registers 750 with the currently requested frequency value. If the comparators 740 determine that one of the previously requested frequency values matches the currently requested frequency value, the corresponding previously stored output of the AFC 435 is output at output 730 of the BMD 650. If none of the previously requested frequency values matches the currently requested frequency value, the output of the AFC 435 is output at output 730 of the BMD 650. Further, the output of the AFC 435 is stored in one of the plurality of registers storing previous outputs of the AFC 435 and the currently requested frequency value is stored in the corresponding one of the plurality of corresponding registers 750.

Figure 8:
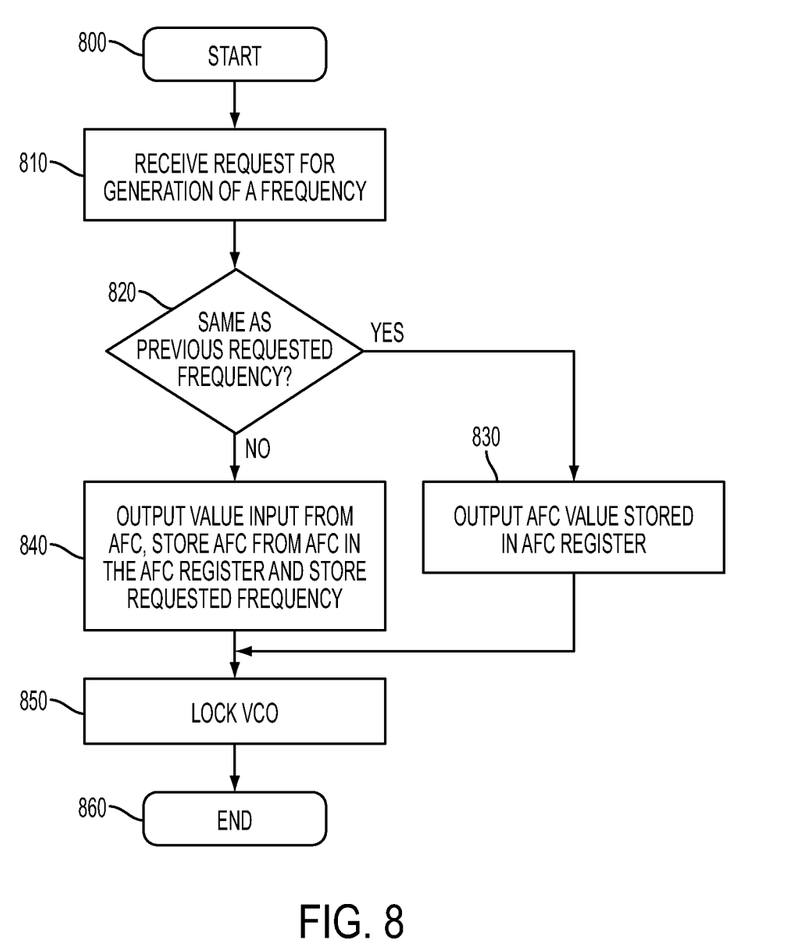
FIG. 8 is a flow chart for a method of efficient time slicing according to an embodiment.

FIG. 8 is a flow chart for a method of efficient time slicing using the embodiment discussed above in FIGS. 6 and 7. The method begins at step 800 and proceeds to step 810.

At step 810, the frequency synthesizer 600 receives a request for generation of a frequency by the PLL 400. The method proceeds to step 820.

At step 820, the comparators 740 in the BMD 650 compare a value of the received frequency request with a value of a previously received frequency request stored in registers 750. If the comparators 740 determine that the currently requested frequency input 425 matches the previously requested frequency input stored in the registers 750 the method proceeds to step 830. If the comparators 740 determine that the currently requested frequency input 425 differs from the previously requested frequency input stored in the registers 750, the method proceeds to step 840.

At step 830, the value stored in the AFC Register 710 is output on the output 730 of the BMD 650. Once the value is output, the method proceeds to step 850.

At step 840, the value input from the AFC 435 on input 720 of the BMD 650 is output on the output 730 of the BMD 650. Further, the AFC value on input 720 is stored in the AFC register 710 and the currently requested frequency stored in registers 750. Once the value is output, the method proceeds to step 850.

At step 850, the PLL locks the output frequency of the VCO 420 divided by the multi-modulus frequency divider with the divided reference frequency. Once the frequency is locked, the method proceeds to step 860 where the method terminates.

In embodiments where the BMD 650 comprises a plurality of AFC registers 710 to store previous outputs of the AFC 435 circuit, a plurality of corresponding registers 750 to store previously requested frequency values and a plurality of corresponding comparators used to compare the previously requested frequency values, the steps 820, 830 and 840 of FIG. 8 are modified in the following manner.

At step 820, the comparators 740 in the BMD 650 compare a value of the received frequency request with values of a previously received frequency request stored in corresponding registers 750. If the comparators 740 determine that the currently requested frequency input 425 matches the previously requested frequency input stored in the registers 750, the method proceeds to step 830. If the comparators 740 determine that the currently requested frequency input 425 differs from the previously requested frequency input stored in the registers 750, the method proceeds to step 840.

At step 830, the value stored in the corresponding AFC Register 710 is output on the output 730 of the BMD 650. Once the value is output, the method proceeds to step 850.

At step 840, the value input from the AFC 435 on input 720 of the BMD 650 is output on the output 730 of the BMD 650. Further, the AFC value on input 720 is stored in a one of the AFC registers 710 and the currently requested frequency stored in corresponding registers 750. Once the value is output, the method proceeds to step 850.

The above embodiments are for burst mode reception by a receiver. The above apparatus and methods are also applicable to any transmission system, wired or wireless configurable to transmit or receive signals only a portion of the time. The above embodiments of the frequency synthesizer with burst mode detector are applicable to a transmitter only transmitting a portion of the time. Thus, for example, the manufacture or use in a transmitter of a mobile device configured to transmit burst mode data to a cellular or other wireless network is anticipated by this application. As are, for example, the manufacture or use of transmitters and receivers for modems for wired networks such as switchers, routers, DSL and ADSL. Further, for example, manufacture or use of transmitters and receivers for communication within a device such as a handheld device, computer, server, router or switcher. The above embodiments are also anticipated for devices that communicate using optical carriers such as line of site optical transmitters or receivers and fiber optic transmitters or receivers. Moreover, the above embodiments are also anticipated for devices that merely intermittently produce or receive signals. For example, nuclear magnetic resonance machines, radar, LI DAR, range finding devices and astronomical telescopes.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An apparatus for efficient time slicing comprising:
a phase lock loop (PLL) circuit having a voltage controlled oscillator (VCO);
an auto-frequency calibration (AFC) circuit coupled with the PLL circuit and adapted to output a value to select a frequency range of the VCO; and
a burst mode detector (BMD), coupled with the AFC circuit and comprising an AFC register adapted to store an output of the AFC circuit, the BMD configured to receive a currently requested frequency and determine whether the currently requested frequency differs from a previously requested frequency.

2. The apparatus according to claim 1, the BMD further comprising a register storing the previously requested frequency, and a comparator coupled with the register, and the BMD adapted to output the output of the AFC circuit if the currently requested frequency and the previously requested frequency differ.

3. The apparatus according to claim 2, the BMD adapted to output a previous stored output of the AFC circuit if the currently requested frequency and the previously requested frequency match.

4. The apparatus according to claim 1, the AFC adapted to perform a binary search to select the frequency range of the VCO.

5. The apparatus according to claim 1, the VCO comprising a switch capacitor bank adapted to define the frequency range of the VCO.

6. The apparatus according to claim 5, the switch capacitor bank adapted to define the frequency range of the VCO based on the output of the BMD.

7. The apparatus according to claim 1, the BMD comprising:
a plurality of additional registers adapted to store a previously requested frequency; and
a plurality of comparators, each comparator corresponding to one of the registers.

8. The apparatus according to claim 7, each of the plurality of comparators coupled with one of the additional registers and adapted to output a previous value stored in the AFC register if the currently requested frequency and the previously requested frequency match.

9. A method of efficient time slicing comprising:
receiving a request for generation of a frequency by a phase lock loop (PLL) with a burst mode detector (BMD);
comparing a value of the received frequency request with a value of a stored previously received frequency request;
outputting a selected frequency range for a voltage controlled oscillator (VCO) of the PLL based on the comparison; and
locking the output frequency of the VCO with a reference frequency.

10. The method according to claim 9, the outputted selected frequency range corresponding to a stored selected frequency range if the value of the received frequency request and the value of the stored previously received frequency request match.

11. The method according to claim 9, the outputted selection frequency range corresponding to an output of an auto-frequency calibration (AFC) circuit if the value of the received frequency request and the value of the stored previously received frequency request differ.

12. The method according to claim 11, determining an optimum selected frequency range for the PLL if the value of the stored received frequency request and the value of the previously received frequency request differ.

13. The method according to claim 12, further comprising searching for the optimum selected frequency range using a binary search algorithm.

14. The method according to claim 12, further comprising storing the optimum selected frequency range in the BMD.

15. The method according to claim 13, selecting of the frequency range for the VCO performed by selecting a capacitor in a switch capacitor bank.

16. The method according to claim 9, further comprising:
storing a plurality of values of previously requested frequencies and corresponding selected frequency ranges in the BMD; and
selecting a frequency range of the stored corresponding selected frequency ranges as the selected frequency range to be output, if the value of the received frequency request and one of the plurality of values of the previously requested frequencies match.

17. A method of efficient time slicing comprising:
receiving a request for generation of a frequency by a phase lock loop (PLL) circuit having a burst mode detector (BMD);
outputting a selection frequency range corresponding to a stored selection frequency range if the value of the received frequency request and the value of the previously received frequency request match;
outputting a selection frequency range corresponding to an output of an auto-frequency calibration (AFC) circuit and storing the output of the AFC circuit if the value of the received frequency request and the value of the previously received frequency request differ; and selecting a frequency range for a voltage controlled oscillator of the PLL based on the output selection frequency range.

18. The apparatus of claim 1, wherein the currently requested frequency is divided into more than one input and the BMD is configured to receive the more than one input.

19. The apparatus of claim 18, wherein the more than one input comprises an integer portion input and a fractional portion input.

20. The method of claim 17, further comprising receiving the received frequency request as more than one input.

* * * * *